(12) United States Patent
Soendker et al.

(10) Patent No.: US 8,106,487 B2
(45) Date of Patent: Jan. 31, 2012

(54) SEMICONDUCTOR DEVICE HAVING AN INORGANIC COATING LAYER APPLIED OVER A JUNCTION TERMINATION EXTENSION

(75) Inventors: Erich H. Soendker, Granada Hills, CA (US); Thomas A. Hertel, Santa Clarita, CA (US); Horacio Saldivar, Canoga Park, CA (US)

(73) Assignee: Pratt & Whitney Rocketdyne, Inc., Canoga Park, CA (US)

( * ) Notice: Subject to any disclaimer, the term of this patent is extended or adjusted under 35 U.S.C. 154(b) by 346 days.

(21) Appl. No.: 12/342,179

(22) Filed: Dec. 23, 2008

(65) Prior Publication Data

US 2010/0155907 A1 Jun. 24, 2010

(51) Int. Cl.
*H01L 23/00* (2006.01)
(52) U.S. Cl. ........................................ 257/632
(58) Field of Classification Search .............. 257/632; 438/778
See application file for complete search history.

(56) References Cited

U.S. PATENT DOCUMENTS

| | | | |
|---|---|---|---|
| 4,060,822 A | 11/1977 | Jantsch et al. | |
| 4,305,084 A | 12/1981 | Temple | |
| 4,647,472 A | 3/1987 | Hiraki et al. | |
| 4,648,174 A | 3/1987 | Temple et al. | |
| 4,667,393 A | 5/1987 | Ferla et al. | |
| 4,780,426 A | 10/1988 | Koshino et al. | |
| 4,783,690 A * | 11/1988 | Walden et al. | 257/140 |
| 4,892,836 A | 1/1990 | Andreini et al. | |
| 4,904,609 A | 2/1990 | Temple | |
| 4,924,291 A | 5/1990 | Lesk et al. | |
| 4,927,772 A | 5/1990 | Arthur et al. | |
| 4,999,684 A | 3/1991 | Temple | |
| 5,041,896 A | 8/1991 | Temple et al. | |
| 5,079,176 A | 1/1992 | Prentice | |
| 5,089,427 A | 2/1992 | Schoenberg | |
| 5,202,275 A | 4/1993 | Sugiura et al. | |
| 5,244,820 A | 9/1993 | Kamata et al. | |
| 5,331,191 A | 7/1994 | Sugiura et al. | |
| 5,345,101 A | 9/1994 | Tu | |
| 5,381,031 A | 1/1995 | Shibib | |
| 5,396,100 A | 3/1995 | Yamasaki et al. | |
| 5,401,682 A | 3/1995 | Yang | |
| 5,424,563 A | 6/1995 | Temple et al. | |
| 5,552,625 A | 9/1996 | Murakami et al. | |
| 5,557,147 A | 9/1996 | Sugiura et al. | |
| 5,614,421 A | 3/1997 | Yang | |
| 5,712,502 A | 1/1998 | Mitlehner et al. | |
| 5,726,469 A | 3/1998 | Chen | |
| 5,739,589 A | 4/1998 | Sugiura et al. | |
| 5,747,863 A | 5/1998 | Shoda | |

(Continued)

OTHER PUBLICATIONS

Otilia Biserica, Philippe Godignon, Gheorghe Brezeanu, Marian Badila, Jose Rebollo, "Design of a Reliable Planar Edge Termination for SIC Power Devices," Semiconductor Conference, CAS 2001 Proceedings, ISBN 0-7803-6666-2. 2001, vol. 2, pp. 353-356.

(Continued)

*Primary Examiner* — Marcos D. Pizarro
*Assistant Examiner* — Suian Tang
(74) *Attorney, Agent, or Firm* — Carlson Gaskey & Olds, P.C.

(57) ABSTRACT

A semiconductor device includes an inorganic coating layer to at least partially cover a junction termination extension.

20 Claims, 1 Drawing Sheet

U.S. PATENT DOCUMENTS

| | | | |
|---|---|---|---|
| 5,780,882 | A | 7/1998 | Sugiura et al. |
| 5,801,836 | A | 9/1998 | Bakowski et al. |
| 5,811,316 | A | 9/1998 | Sugiura et al. |
| 5,812,191 | A | 9/1998 | Orava et al. |
| 5,844,249 | A | 12/1998 | Takano et al. |
| 5,854,141 | A | 12/1998 | Cronin et al. |
| 5,861,658 | A | 1/1999 | Cronin et al. |
| 5,864,167 | A | 1/1999 | Cutter |
| 5,866,907 | A | 2/1999 | Drukier et al. |
| 5,907,181 | A | 5/1999 | Han et al. |
| 5,914,499 | A | 6/1999 | Hermansson et al. |
| 5,914,500 | A | 6/1999 | Bakowski et al. |
| 5,932,894 | A | 8/1999 | Bakowski et al. |
| 5,959,342 | A | 9/1999 | Shibib |
| 5,967,795 | A | 10/1999 | Bakowsky et al. |
| 5,977,605 | A | 11/1999 | Bakowsky et al. |
| 6,002,159 | A | 12/1999 | Bakowski et al. |
| 6,004,839 | A | 12/1999 | Hayashi et al. |
| 6,011,608 | A | 1/2000 | Tanaka |
| 6,035,013 | A | 3/2000 | Orava et al. |
| 6,040,237 | A | 3/2000 | Bakowski et al. |
| 6,048,734 | A | 4/2000 | Burns et al. |
| 6,057,149 | A | 5/2000 | Burns et al. |
| 6,064,103 | A | 5/2000 | Pfirsch |
| 6,100,111 | A | 8/2000 | Konstantinov |
| 6,104,047 | A | 8/2000 | Watanabe |
| 6,110,763 | A | 8/2000 | Temple |
| 6,127,255 | A | 10/2000 | Sugiura et al. |
| 6,130,098 | A | 10/2000 | Handique et al. |
| 6,169,324 | B1 | 1/2001 | Sugiura et al. |
| 6,215,168 | B1 | 4/2001 | Brush et al. |
| 6,218,254 | B1 | 4/2001 | Singh et al. |
| 6,242,784 | B1 | 6/2001 | Zeng et al. |
| 6,246,076 | B1 | 6/2001 | Lipkin et al. |
| 6,271,021 | B1 | 8/2001 | Burns et al. |
| 6,309,952 | B1 | 10/2001 | Ridley et al. |
| 6,329,675 | B2 | 12/2001 | Singh et al. |
| 6,342,412 | B1 | 1/2002 | Sugiura et al. |
| 6,350,609 | B1 | 2/2002 | Morozov et al. |
| 6,353,236 | B1 | 3/2002 | Yatsuo et al. |
| 6,362,026 | B2 | 3/2002 | Zeng et al. |
| 6,362,075 | B1 | 3/2002 | Czagas et al. |
| 6,431,185 | B1 | 8/2002 | Tomita et al. |
| 6,437,371 | B2 | 8/2002 | Lipkin et al. |
| 6,455,910 | B1 | 9/2002 | Wang |
| 6,455,911 | B1 | 9/2002 | Stephani et al. |
| 6,459,102 | B1 | 10/2002 | Austin et al. |
| 6,462,376 | B1 | 10/2002 | Wahl et al. |
| 6,465,824 | B1 | 10/2002 | Kwasnick et al. |
| 6,469,359 | B2 | 10/2002 | Bakowski et al. |
| 6,486,080 | B2 | 11/2002 | Chooi et al. |
| 6,489,659 | B2 | 12/2002 | Chakrabarti et al. |
| 6,514,779 | B1 | 2/2003 | Ryu et al. |
| 6,528,373 | B2 | 3/2003 | Lipkin et al. |
| 6,534,347 | B2 | 3/2003 | Zeng et al. |
| 6,548,847 | B2 | 4/2003 | Sugiura et al. |
| 6,566,726 | B1 | 5/2003 | Onose et al. |
| 6,573,128 | B1 | 6/2003 | Singh |
| 6,661,058 | B2 * | 12/2003 | Ahn et al. ............ 257/344 |
| 6,673,163 | B2 | 1/2004 | Tomita et al. |
| 6,673,662 | B2 | 1/2004 | Singh |
| 6,680,216 | B2 | 1/2004 | Kwasnick et al. |
| 6,693,011 | B2 | 2/2004 | Wahl et al. |
| 6,693,308 | B2 | 2/2004 | Sankin et al. |
| 6,693,327 | B2 | 2/2004 | Priefert et al. |
| 6,703,684 | B2 | 3/2004 | Udrea et al. |
| 6,759,719 | B2 | 7/2004 | Zeng et al. |
| 6,767,783 | B2 | 7/2004 | Casady et al. |
| 6,770,911 | B2 | 8/2004 | Agarwal et al. |
| 6,770,917 | B2 | 8/2004 | Barthelmess et al. |
| 6,787,313 | B2 | 9/2004 | Morozov et al. |
| 6,821,824 | B2 | 11/2004 | Minato et al. |
| 6,838,771 | B2 | 1/2005 | Tanaka et al. |
| 6,841,812 | B2 | 1/2005 | Zhao |
| 6,844,251 | B2 | 1/2005 | Shenai et al. |
| 6,856,350 | B2 | 2/2005 | Orava et al. |
| 6,867,495 | B2 | 3/2005 | Czagas et al. |
| 6,872,012 | B2 | 3/2005 | Watanabe |
| 6,894,334 | B2 | 5/2005 | Sugiura et al. |
| 6,900,518 | B2 | 5/2005 | Udrea et al. |
| 6,911,183 | B1 | 6/2005 | Handique et al. |
| 6,911,683 | B2 | 6/2005 | Konishi et al. |
| 6,927,102 | B2 | 8/2005 | Udrea et al. |
| 6,946,364 | B2 | 9/2005 | Czagas et al. |
| 6,949,385 | B1 | 9/2005 | Burns et al. |
| 6,949,775 | B1 | 9/2005 | Takada |
| 6,956,238 | B2 | 10/2005 | Ryu et al. |
| 6,967,407 | B2 | 11/2005 | Otani et al. |
| 6,972,436 | B2 | 12/2005 | Das et al. |
| 6,982,181 | B2 | 1/2006 | Hideo |
| 6,989,566 | B2 | 1/2006 | Noda et al. |
| 6,998,322 | B2 | 2/2006 | Das et al. |
| 7,004,184 | B2 | 2/2006 | Handique et al. |
| 7,005,050 | B2 | 2/2006 | Burns et al. |
| 7,009,222 | B2 | 3/2006 | Yang |
| 7,026,650 | B2 | 4/2006 | Ryu et al. |
| 7,033,950 | B2 | 4/2006 | Merrett et al. |
| 7,049,701 | B2 | 5/2006 | Usui |
| 7,066,453 | B2 | 6/2006 | Burns et al. |
| 7,071,503 | B2 | 7/2006 | Dohnke et al. |
| 7,105,387 | B2 | 9/2006 | Minato et al. |
| 7,129,542 | B2 | 10/2006 | Park |
| 7,129,576 | B2 | 10/2006 | Humpston |
| 7,132,321 | B2 | 11/2006 | Kub et al. |
| 7,135,359 | B2 | 11/2006 | Agarwal et al. |
| 7,144,797 | B2 | 12/2006 | Chow et al. |
| 7,148,089 | B2 | 12/2006 | Hung et al. |
| 7,166,866 | B2 | 1/2007 | Zeng et al. |
| 7,169,699 | B2 | 1/2007 | Takada |
| 7,187,058 | B2 | 3/2007 | Schmidt |
| 7,193,289 | B2 | 3/2007 | Adkisson et al. |
| 7,195,036 | B2 | 3/2007 | Burns et al. |
| 7,208,810 | B2 | 4/2007 | Wright |
| 7,214,627 | B2 | 5/2007 | Merrett et al. |
| 7,221,010 | B2 | 5/2007 | Ryu |
| 7,224,056 | B2 | 5/2007 | Burtzlaff et al. |
| 7,226,818 | B2 | 6/2007 | Malenfant et al. |
| 7,230,337 | B2 | 6/2007 | Usami et al. |
| 7,235,439 | B2 | 6/2007 | Udrea et al. |
| 7,247,525 | B2 | 7/2007 | Tanaka et al. |
| 7,250,311 | B2 | 7/2007 | Aoki et al. |
| 7,274,083 | B1 | 9/2007 | Sankin et al. |
| 7,282,753 | B2 | 10/2007 | Kub et al. |
| 7,285,475 | B2 | 10/2007 | Czagas et al. |
| 7,298,030 | B2 | 11/2007 | McWilliams et al. |
| 7,304,363 | B1 | 12/2007 | Shah |
| 7,345,342 | B2 | 3/2008 | Challa et al. |
| 7,372,154 | B2 | 5/2008 | Tanaka et al. |
| 7,381,646 | B2 | 6/2008 | Su et al. |
| 7,385,246 | B2 | 6/2008 | Beasom |
| 7,411,272 | B2 | 8/2008 | Udrea et al. |
| 7,419,877 | B2 | 9/2008 | Ryu et al. |
| 7,442,637 | B2 | 10/2008 | Su et al. |
| 7,453,119 | B2 | 11/2008 | Bhalla et al. |
| 7,454,831 | B2 | 11/2008 | Kurosawa et al. |
| 2005/0277256 | A1 | 12/2005 | Ahn et al. |
| 2007/0170436 | A1* | 7/2007 | Sugawara ............ 257/77 |
| 2008/0160685 | A1* | 7/2008 | Sankin et al. ............ 438/180 |

OTHER PUBLICATIONS

Translation of Office Action from German Patent and Trademark Office, German Patent Application No. 10 2009 058 418.5-33, dated Dec. 29, 2010.

* cited by examiner

SEMICONDUCTOR DEVICE HAVING AN INORGANIC COATING LAYER APPLIED OVER A JUNCTION TERMINATION EXTENSION

BACKGROUND

The present disclosure relates to integrated circuit chips and more particularly to a semiconductor device having an inorganic coating layer.

The advent of relatively high temperature semiconductor devices which can theoretically operate at high temperatures from 200° C. to 300° C. base plate temperatures have become feasible as compared to silicon's maximum base plate temperatures of 85° C. to 125° C.

A multilayer interconnection structure typically interconnects various semiconductor elements formed on a common substrate of a semiconductor device. The multilayer interconnection structure includes a number of interlayer insulation films on the common substrate to isolate the semiconductor elements.

A junction termination extension is located along an outer periphery of the semiconductor substrate so as to block the penetration of moisture or corrosive gas into the interior of the semiconductor device along the interface between the interlayer insulation films.

Conventional junction termination extensions are manufactured of organic materials. Although effective in the relatively low temperature of silicon's maximum base plate temperatures, organic guard rings may carbonize above temperatures of approximately 250° C. and lose their dialectic isolation properties.

SUMMARY

A semiconductor device according to an exemplary aspect of the present disclosure includes an inorganic coating layer applied to at least a portion of a contact to at least partially cover a junction termination extension.

A method of fabricating a semiconductor device according to an exemplary aspect of the present disclosure includes laser depositing an inorganic coating layer to at least partially cover a junction termination extension.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
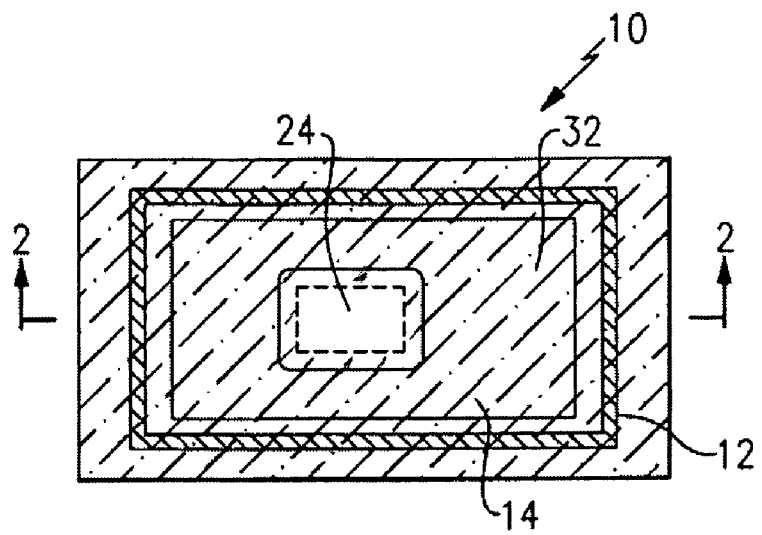
FIG. 1 is a general schematic view of an integrated circuit.

FIG. 1 schematically illustrates an integrated circuit chip 10. A junction termination extension (JTE) 12 is formed along an outer periphery of a semiconductor device 14 such that the JTE 12 continuously surrounds the semiconductor device 14. The JTE 12 may include one or more guard rings which may be formed simultaneously to the formation of multilayer interconnection structures within the semiconductor device 14 as generally understood.

Figure 2:
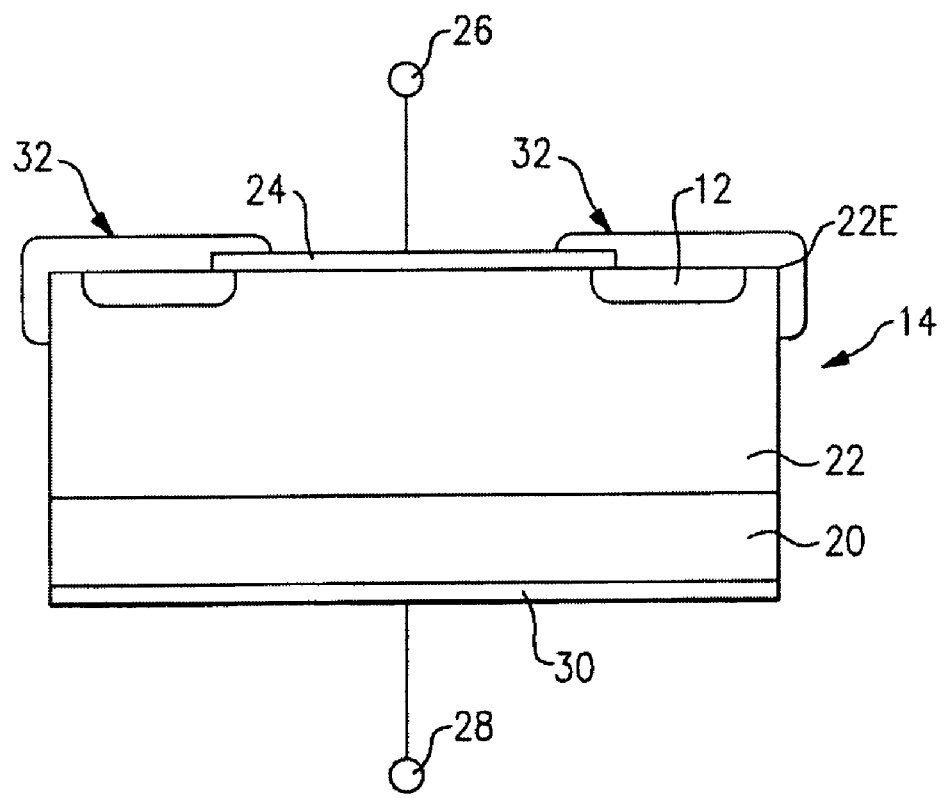
FIG. 2 is a sectional view through the semiconductor chip illustrating a inorganic coating layer applied from a top contact and around an edge of a substrate.

Referring to FIG. 2, the semiconductor device 14 may be formed on a silicon carbide (SiC) substrate 20. Silicon carbide (SiC) offers significant advantages for power-switching devices because the critical field for avalanche breakdown is about ten times higher than in silicon. Although a particular Schottky barrier diode (SBD) semiconductor device 14 is schematically illustrated in the disclosed non-limiting embodiment, it should be understood that various semiconductor devices such as diodes, e.g., p-i-n, Schottky; transistors, e.g., junction field-effect transistor, metal-oxide-semiconductor field-effect transistor, bipolar junction transistor; thyristors, e.g., gate turn-off and others will alternatively benefit herefrom.

The substrate 20 includes a lightly doped n-type blocking epilayer 22 grown by, for example, chemical vapor deposition such that the substrate 20 is adjacent to the blocking epilayer 22. It should be understood that other P and N type blocking layers including P+ and N+ dopant concentrations may alternatively or additionally be provided over the substrate 20. The doping and thickness of each epilayer are defined to achieve the desired blocking voltage. It should be understood that various multiples of epilayers may be defined herein as other semiconductor devices are manufactured with different or additional layers as compared to the Schottky barrier diode (SBD) semiconductor device schematically illustrated in the disclosed non-limiting embodiment. Various aspects of the present disclosure are described with reference to an epilayer formed adjacent or on the substrate or upon another layer. As will be appreciated by those of skill in the art, references to an epilayer formed on or adjacent another epilayer or substrate contemplates that additional layers may intervene.

A top contact 24, here illustrated as a Schottky barrier on the top surface of the blocking epilayer 22 is formed by implanting the JTE 12 at the surface, then depositing the Schottky metal such that the top contact 24 may be adjacent the blocking epilayer 22 and the substrate 20. It should be understood that the top contact 24 may be deposited at least partially within the epilayer 22 and or the substrate 20 and still be considered adjacent to either or both. The JTE 12 prevents field crowding at the periphery of the top contact 24 in the blocking state, which significantly reduces the blocking voltage. It should be understood that contacts other than the Schottky barrier may be so deposited for other semiconductor devices. In the disclosed non-limiting embodiment, an anode 26 communicates with the top contact 24 and a cathode 28 communicates with an ohmic contact 30 adjacent the substrate 20.

The JTE 12 may utilize a fully activated p-type implant. The total dose in the JTE 12 may be selected so that the layer will be fully depleted before the peak field is high enough to cause avalanche breakdown. The exposed acceptor charge in the JTE 12 terminates electric field lines that would otherwise extend to the edge of the top contact 24 to thereby reduce field crowding at the metal edge.

An inorganic coating layer 32 that defines a dielectric coating with relatively high voltage strength is deposited at least partially over the top contact 24 and around an edge 22E of the blocking epilayer 22 and/or the substrate 20. The inorganic coating layer 32 extends to at least partly overlay the top contact 24 so as to prevent a breakdown event around the JTE 12 through the air or other medium outside of the blocking epilayer 22 and/or the substrate 20.

The inorganic coating layer 32 may be applied through a Pulsed Laser Deposition (PLD) process such as that provided by Blue Wave Semiconductors, Inc. of Columbia, Md. USA. The PLD process facilitates multiple combinations of metal-oxides and nitrides on the SiC substrate as well as contact manufactured of Si, AlN, Al, Cu, Ni or any other such surface. The PLD process facilitates a robust coating and the engineered material allows, in one non-limiting embodiment, 1.6 microns of the inorganic coating layer 32 to withstand 1200V.

The inorganic coating layer 32 which, in one non-limiting embodiment is hafnium oxide applied by the Pulsed Laser Deposition (PLD) process facilitates a reliable high temperature semiconductor package that will readily withstand temperatures from 200° C. to 300° C. The inorganic coating layer 32 provides a relatively close coefficient of thermal expansion (CTE) match to the SiC substrate so as to resist the thermal cycling typical of high temperature operations.

Through use of the inorganic coating layer 32 of inorganic materials such as Hafnium Oxide in place of organic material, the inorganic coating layer 32 will not carbonize and will maintain dielectric isolation. A multilayer construction of dielectric stacks, with atomic and coating interface arrangements of crystalline and amorphous films.

It should be understood that like reference numerals identify corresponding or similar elements throughout the several drawings. It should also be understood that although a particular component arrangement is disclosed in the illustrated embodiment, other arrangements will benefit herefrom.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the invention may be practiced other than as specifically described. For that reason the appended claims should be studied to determine true scope and content.

What is claimed is:

1. A semiconductor device, comprising:
a substrate;
a contact adjacent said substrate;
a junction termination extension adjacent said contact;
an inorganic coating layer applied to at least a portion of said contact to at least partially cover said junction termination extension, said contact in direct communication with said substrate without interruption by said inorganic coating layer.

2. The semiconductor device as recited in claim 1, wherein said substrate includes a Silicon carbide (SiC) substrate.

3. The semiconductor device as recited in claim 1, wherein said substrate includes a blocking layer.

4. The semiconductor device as recited in claim 1, wherein said substrate includes an n-type blocking layer.

5. The semiconductor device as recited in claim 1, wherein said substrate includes a p-type blocking layer.

6. The semiconductor device as recited in claim 1, wherein said junction termination extension is embedded within said substrate.

7. The semiconductor device as recited in claim 6, wherein said contact directly communicates with said junction termination extension without interruption by said inorganic coating layer.

8. The semiconductor device as recited in claim 1, wherein said junction termination extension is formed along an outer periphery of the semiconductor device.

9. The semiconductor device as recited in claim 8, wherein said inorganic coating layer extends around an edge of said substrate.

10. The semiconductor device as recited in claim 1, wherein said inorganic coating layer extends around an edge of said substrate.

11. The semiconductor device as recited in claim 1, wherein said inorganic coating layer is Hafnium Oxide.

12. The semiconductor device as recited in claim 1, wherein an anode directly communicates with said contact.

13. The semiconductor device as recited in claim 12, wherein a cathode directly communicates with an ohmic contact adjacent said substrate.

14. The semiconductor device as recited in claim 1, wherein said substrate includes an epilayer, and wherein said contact is in direct communication with said epilayer.

15. The semiconductor device as recited in claim 1, wherein said semiconductor device is a Schottky barrier diode, and a Schottky barrier is formed between said contact and said substrate.

16. An integrated circuit chip comprising:
a semiconductor device;
a contact on a top surface of said semiconductor device;
a junction termination extension formed adjacent an outer periphery of said semiconductor device;
an inorganic coating layer which at least partially covers said junction termination extension; and
wherein said contact directly communicates with said semiconductor device without interruption by said inorganic coating layer.

17. The integrated circuit chip as recited in claim 16, wherein said inorganic coating layer extends around an edge of an epilayer supported on a substrate.

18. The integrated circuit chip as recited in claim 17, wherein said junction termination extension is embedded within said epilayer.

19. The integrated circuit chip as recited in claim 16, wherein said inorganic coating layer is Hafnium Oxide.

20. The semiconductor device as recited in claim 16, wherein said semiconductor device is a Schottky barrier diode, and a Schottky barrier is formed between said contact and said semiconductor device.

* * * * *